(12) United States Patent
Hino et al.

(10) Patent No.: US 8,182,594 B2
(45) Date of Patent: May 22, 2012

(54) ELECTROLESS NICKEL PLATING LIQUID

(75) Inventors: Eiji Hino, Kitaibaraki (JP); Masashi Kumagai, Kitaibaraki (JP)

(73) Assignee: Nippon Mining & Metals Co., Ltd., Minato-Ku, Tokyo (JP)

( * ) Notice: Subject to any disclaimer, the term of this patent is extended or adjusted under 35 U.S.C. 154(b) by 61 days.

(21) Appl. No.: 11/920,021

(22) PCT Filed: Sep. 26, 2006

(86) PCT No.: PCT/JP2006/319063
§ 371 (c)(1), (2), (4) Date: Nov. 5, 2007

(87) PCT Pub. No.: WO2007/043333
PCT Pub. Date: Apr. 19, 2007

(65) Prior Publication Data
US 2009/0064892 A1    Mar. 12, 2009

(30) Foreign Application Priority Data

Oct. 7, 2005   (JP) .................. 2005-294316

(51) Int. Cl.
*C23C 18/48*   (2006.01)

(52) U.S. Cl. ...... 106/1.22; 106/1.27; 106/220; 205/167; 205/168; 205/163; 427/99.5; 427/437; 427/443.1

(58) Field of Classification Search .................. None
See application file for complete search history.

(56) References Cited

U.S. PATENT DOCUMENTS

| | | | |
|---|---|---|---|
| 3,562,000 A * | 2/1971 | Parker | 427/383.7 |
| 3,977,884 A * | 8/1976 | Gulla et al. | 106/1.26 |
| 4,632,857 A * | 12/1986 | Mallory, Jr. | 428/209 |
| 5,269,838 A * | 12/1993 | Inoue et al. | 427/438 |
| 5,437,887 A * | 8/1995 | Yarkosky et al. | 427/131 |
| 5,718,745 A * | 2/1998 | Itoh et al. | 106/1.22 |
| 5,910,340 A * | 6/1999 | Uchida et al. | 427/437 |
| 6,273,943 B1 * | 8/2001 | Chiba et al. | 106/1.22 |

FOREIGN PATENT DOCUMENTS

| | | |
|---|---|---|
| CN | 1410592 | 4/2003 |
| EP | 0 215 381 | 3/1987 |
| JP | 53-3326 | 2/1978 |
| JP | 6-280038 | 10/1994 |
| JP | 7-233479 | 9/1995 |
| JP | 2003-055789 | * 2/2003 |
| JP | 2003-268561 | 9/2003 |
| JP | 3479639 | 10/2003 |

* cited by examiner

*Primary Examiner* — Melvin C Mayes
*Assistant Examiner* — Smita Patel
(74) *Attorney, Agent, or Firm* — Flynn, Thiel, Boutell & Tanis, P.C.

(57) ABSTRACT

An electroless nickel plating liquid capable of forming an underbarrier metal for metal bumps or solder bumps by electroless nickel plating with a uniform film thickness on silicon wafers composed of multiple IC chips contains a water-soluble nickel salt, a reducing agent, a complexing agent, and a pH buffer, wherein lead ion is contained at 0.01-1 ppm, cobalt ion is contained at 0.01-1 ppm, and a sulfur compound is contained at 0.01-1 ppm.

9 Claims, 2 Drawing Sheets

EXAMPLE 1   MAGNIFICATION x500

MAGNIFICATION x5000

EXAMPLE 1  MAGNIFICATION x500

MAGNIFICATION x5000

COMPARATIVE EXAMPLE 1
  MAGNIFICATION x500

COMPARATIVE EXAMPLE 1
P ELECTRODE SURFACE
  MAGNIFICATION x5000

COMPARATIVE EXAMPLE 2
  MAGNIFICATION x500

COMPARATIVE EXAMPLE 2
P ELECTRODE SURFACE
  MAGNIFICATION x5000

COMPARATIVE EXAMPLE 3
MAGNIFICATION x500

COMPARATIVE EXAMPLE 3
P ELECTRODE SURFACE
MAGNIFICATION x5000

COMPARATIVE EXAMPLE 4
MAGNIFICATION x500

COMPARATIVE EXAMPLE 4
P ELECTRODE SURFACE
MAGNIFICATION x5000

COMPARATIVE EXAMPLE 5
MAGNIFICATION x500

COMPARATIVE EXAMPLE 5
P ELECTRODE SURFACE
MAGNIFICATION x5000

ELECTROLESS NICKEL PLATING LIQUID

TECHNICAL FIELD

The present invention relates to an electroless nickel plating liquid, and more particularly to an electroless Ni plating liquid capable of forming an underbarrier metal (UBM) for Ni metal bumps (protruding sections) or solder bumps by electroless nickel plating with a uniform film thickness on silicon wafers composed of multiple IC chips.

BACKGROUND ART

Plating by an electroless plating method utilizes a reduction reaction induced by contact with a material surface so that plating can be performed with a uniform thickness, even on receding zones. In particular, because electroless Ni plating typically excels in corrosion resistance and wear resistance, the method has been used for a long time for surface treatment of raw material components, and the history thereof is long. Presently, this method is widely used for the primary treatment of solder joints of printed wiring boards or primary treatment of compact disks (CD) and hard disk drives (HDD).

Because lead compounds are introduced as stabilizers in electroless nickel plating liquids that have been generally used for the primary treatment of solders, the nickel film obtained also contains lead.

However, recent establishment of the RoHS Directive in the EU (European Union) placed further limitations on hazardous substances such as lead and chromium in electronic components (presently, 0.1% or less for lead), and these restrictions are expected to be even more stringent in the future. The conventional types of solders are generally eutectics of tin and lead, but in recent years lead-free two-component or three-component solders such as tin-silver-zinc and tin-silver-bismuth were put to practical use. Because the restrictions of the RoHS Directive are applied not only to a solder, but also to the entire electronic devices, these restrictions are also valid for a nickel film obtained by an electroless process that has generally been used widely for primary treatment for soldering. For example, the restrictions of the RoHS Directive have also to be taken into consideration in the electroless nickel plating method described in Patent Document 1 that improved the corrosion resistance of a nickel coating and prevented a decrease in solder wettability.

When a nickel underbarrier metal (UBM) for solder bumps or Ni metal bumps (protruding sections) is formed by electroless nickel plating on a silicon wafer composed of multiple IC chips, new problems arise: the electric potential difference inside the integrated circuit (for example, if a p-type semiconductor is formed by further doping boron into a n-type semiconductor (Si doped with microquantity of phosphorus), a n/p diffusion layer appears at the junction surface, then, an electric potential difference of about 0.4 V appears between P/N electrodes by exposing the IC to light of 100 Lux); due to fine electrode pads, the height of the nickel metal deposited on the electrode pad is uneven and, in the worst case scenario, absolutely no nickel metal is deposited. Consequently, since a large number of problems have not yet been solved, electroless nickel liquids are considered to be difficult to use as silicon wafer bumps or UBN.

For this reason, at present, Au bumps with a height of about 15 μm are fabricated by a gold (Au) electroplating method or a barrier metal with a height of about 5 μm is fabricated by using a combination of sputtering and electroplating for UBM. However, the Au plating method involves a complex process and a high cost. Because the sputtering and electroplating methods require etching of the diffusion preventing layer and seed layer to which electricity is supplied, the process is complex and productivity is low.

Patent Document 1: Japanese Patent No. 3479639 Publication

SUMMARY OF THE INVENTION

An object of the present invention is to provide an electroless nickel plating liquid containing a lower amount of lead that satisfies the restrictions of the RoHS Directive, inhibits height nonuniformity and produces uniform thickness of the nickel metal deposited on the electrode pad, even when a UBM for solder bumps or nickel metal bumps is formed on a semiconductor wafer by electroless nickel plating.

The results of the comprehensive study conducted to solve the above-described problems revealed that introducing lead ion, cobalt ion, and a sulfur compound at specific concentrations into an electroless nickel plating liquid is effective to solve the problems. This finding led to the present invention.

Thus, the present invention relates to an electroless nickel plating liquid comprising a water-soluble nickel salt, a reducing agent, a complexing agent, and a pH buffer, wherein lead ion is contained at 0.01-1 ppm, cobalt ion is contained at 0.01-1 ppm, and a sulfur compound is contained at 0.01-1 ppm.

EFFECT OF THE INVENTION

Using the electroless nickel plating liquid in accordance with the present invention achieves satisfaction of the restrictions of the RoHS Directive and forming of a UBM for solder bumps or Ni metal bumps with uniform film thickness by electroless Ni plating on a silicon wafer composed of multiple IC chips. Thereby, metal bumps and UBM can be fabricated in an easy manner and at a low cost, without using a Au plating method, sputtering, and electroplating method involving complex and expensive processes.

BEST MODE FOR CARRYING OUT THE INVENTION

Figure 1:
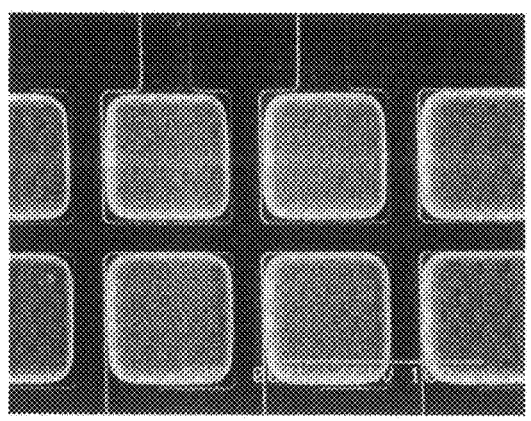
FIG. 1 This is a photograph of an enlarged view by an optical microscope (magnification 500) and a photograph of an enlarged view by an electron microscope (magnification 5000), showing the result of electroless nickel plating on an aluminum pad in Example 1.
Figure 1:
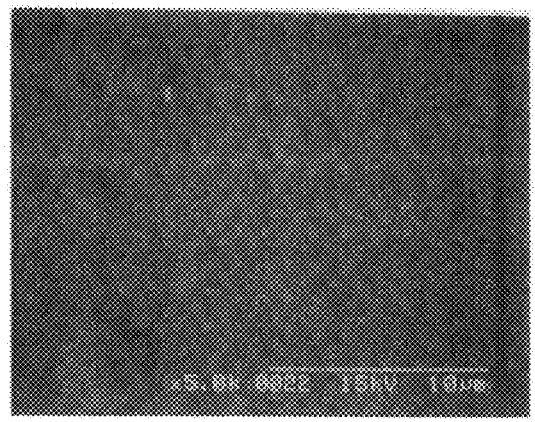

The electroless nickel plating liquid of the present invention comprises a water-soluble nickel salt, a reducing agent, a pH buffer, and a complexing agent, and further comprises lead ion, cobalt ion, and a sulfur compound at predetermined concentrations, and optionally comprises a stabilizer, a reaction enhancer, and a surfactant as needed.

Examples of the water-soluble nickel salt used in the electroless nickel plating liquid of the present invention include nickel sulfate, nickel chloride, and nickel hypophosphite.

Examples of the reducing agent include hypophosphites, dimethylamine borane, trimethylamine borane, and hydrazine.

Examples of the pH buffer include salts of carboxylic acids such as acetic acid, formic acid, succinic acid, and malonic acid, and ammonium salts.

Examples of the complexing agent include hydroxycarboxylic acids such as lactic acid, malic acid, and citric acid, and amino acids such as glycine and alanine.

In accordance with the present invention, lead ion and sulfur compounds serve as stabilizers, but other stabilizers may be also used, examples thereof including ions of heavy metals such as bismuth, selenium, and thallium.

Examples of the reaction enhancer include amine compounds such as ethylene diamine and triethylene tetramine.

Examples of the surfactant include nonionic alcohols such as polyethylene glycol, sulfonic acid-based anionic surfactants, and amine oxide-based cationic surfactants.

Reducing the concentration of lead ion in the electroless nickel plating liquid is an essential condition to solve the problem of lead concentration in nickel coatings restricted by the RoHS Directive, but a simple decrease in the concentration of lead ions generates anomalous lump-like depositions in the four corners of the nickel-deposited surface. Therefore, in order to inhibit such lump-like anomalous depositions, the concentration of lead ion in the electroless nickel plating liquid has to be at a necessary minimum level. These lump-like anomalous depositions can be inhibited if the concentration of sulfur compound is high, but in this case, nickel can hardly be deposited on fine electrode pads.

Both the addition of cobalt ion and the addition of sulfur compound are essential conditions and are important for the preparation of the electroless Ni plating liquid of the present invention that can solve the problem of the difference in electric potentials inherent to semiconductors and can form a bump on fine electrode pads. If any one of these two additives is absent, unevenness occurs in the thickness of Ni deposited on an electrode pad having the difference in electric potentials inherent to semiconductors and, in severe cases, Ni is not deposited on one electrode. Likewise, Ni is not deposited on fine electrode pads, and serious unevenness in the thickness is caused.

Accordingly, since the three components, namely, lead ion, cobalt ion, and sulfur compound, contained in the electroless nickel liquid affect each other, it is important that the appropriate concentrations of the three components are established.

In the electroless nickel plating liquid of the present invention, lead ion has to be contained at 0.01-1 ppm, more preferably at 0.1-1 ppm. If it is less than 0.01 ppm, lump-like anomalous depositions of nickel easily arise in the four corners of the nickel-deposited surface. The occurrence of such anomalous depositions can be inhibited if the content of lead ion is within the aforementioned range. When above 1 ppm, the content of lead in the nickel coating will exceed 300 ppm. The RoHS Directive requires this content to be equal to or less than 1000 ppm (0.1%), but a lower concentration is preferred in view of the trend for the future as long as other necessary properties are satisfied. Even if lead ion is added in excess of 1 ppm, it results only in an increase of the lead content in nickel.

In order to introduce lead ion into the plating liquid, a lead compound is dissolved in the plating liquid. Examples of the lead compound include lead nitrate and lead acetate.

It is also important that the cobalt ion is contained at 0.01-1 ppm, more preferably 0.3-1 ppm. When no cobalt is added, the deposition rate of nickel decreases even if a sulfur compound is added. Moreover, due to the influence of the difference in electric potential, deposition of nickel, in particular on the N poles of semiconductor electrodes, is impeded. In order to attain the object of the present invention, cobalt ion has to be contained in the plating liquid at 0.01 ppm or more, but if it is high and exceeds 1 ppm, pinholes easily appear on the nickel surface at the initial stage of addition. Pinholes on the nickel surface are undesirable from the standpoint of solder joint strength because the pinholes cause pitting corrosion during electroless substitution plating with gold.

In order to introduce cobalt ion into the plating liquid, a cobalt compound is dissolved in the plating liquid. Examples of the cobalt compound include cobalt sulfate, cobalt acetate, cobalt nitrate, and cobalt carbonate.

The concentration of sulfur compound in the electroless nickel plating liquid is also important and has to be 0.01-1 ppm, more preferably 0.1-0.5 ppm. If the sulfur compound is not added, like as cobalt, the deposition rate of nickel decreases, moreover, due to the influence of the difference in electric potential, the deposition of nickel is impeded in particular on the N poles of semiconductor electrodes. In order to attain the object of the present invention, the concentration of sulfur compound has to be 0.01 ppm or higher. When the sulfur compound is contained at a concentration of more than 1 ppm, nickel is hardly deposited on fine pad sections.

The preferred examples of sulfur compounds for use in the present invention include thiosulfates, thionic acids, thiourea, thiocyanates, thiocarbonates, or salts thereof. Especially preferred sulfur compounds are potassium thiocyanate (other name "rhodane K") and rhodanine.

The electroless nickel plating liquid of the present invention is an aqueous solution and the pH thereof is preferably adjusted to 4-6, more preferably to 4.5-5.5.

The electroless nickel plating liquid of the present invention is used preferably at a bath temperature of 70-90° C., more preferably 75-85° C.

When the pH of the plating liquid and bath temperature are outside the above-described ranges, problems such as a decreased plating rate and facilitated bath decomposition are encountered.

As the plating method, an article to be plated can be immersed in the plating liquid of the present invention.

EXAMPLES

The present invention will be explained below based on an Example thereof, but the present invention is not limited thereto.

Example 1

An electroless nickel plating liquid of the following composition was prepared.

| | |
|---|---|
| NiSO$_4$•6H$_2$O | 25 g/L |
| NaH$_2$PO$_2$•H$_2$O | 25 g/L |
| Malic acid | 4 g/L |
| Succinic acid 2Na | 12 g/L |
| Glycine | 5 g/L |
| Pb(NO$_3$)$_2$ | 0.6 ppm (0.38 ppm as Pb) |
| CoSO$_4$•7H$_2$O | 1.6 ppm (0.32 ppm as Co) |
| KSCN | 0.4 ppm |

Electroless nickel plating was carried out by using this electroless nickel plating liquid. The pH was 5.0 and the plating conditions were: for 30 min at 80° C. The material to be plated was a semiconductor TEG wafer (with n/p electrodes) comprising a large number of IC, and nickel was deposited on aluminum pads of the IC under natural light irradiation at about 100 Lux.

Comparative Example 1

An electroless nickel plating liquid of the following composition was prepared.

| | |
|---|---|
| NiSO$_4$•6H$_2$O | 25 g/L |
| NaH$_2$PO$_2$•H$_2$O | 25 g/L |
| Malic acid | 4 g/L |
| Succinic acid 2Na | 12 g/L |
| Glycine | 5 g/L |
| Pb(NO$_3$)$_2$ | 0.6 ppm (0.38 ppm as Pb) |
| CoSO$_4$•7H$_2$O | 16 ppm (3.2 ppm as Co) |
| KSCN | 0.4 ppm |

Electroless nickel plating was carried out by using this electroless nickel plating liquid. The pH was 5.0 and the plating conditions were: for 30 min at 80° C. The material to be plated was a semiconductor TEG wafer (with n/p electrodes) comprising a large number of IC, and nickel was deposited on aluminum pads of the IC under natural light irradiation at about 100 Lux.

Comparative Example 2

An electroless nickel plating liquid of the following composition was prepared.

| | |
|---|---|
| NiSO$_4$•6H$_2$O | 25 g/L |
| NaH$_2$PO$_2$•H$_2$O | 25 g/L |
| Malic acid | 4 g/L |
| Succinic acid 2Na | 12 g/L |
| Glycine | 5 g/L |
| Pb(NO$_3$)$_2$ | 0.6 ppm (0.38 ppm as Pb) |
| CoSO$_4$•7H$_2$O | 160 ppm (32 ppm as Co) |
| KSCN | 0.4 ppm |

Electroless nickel plating was carried out by using this electroless nickel plating liquid. The pH was 5.0 and the plating conditions were: for 30 min at 80° C. The material to be plated was a semiconductor TEG wafer (with n/p electrodes) comprising a large number of IC, and nickel was deposited on aluminum pads of the IC under natural light irradiation at about 100 Lux.

Comparative Example 3

An electroless nickel plating liquid of the following composition was prepared.

| | |
|---|---|
| NiSO$_4$•6H$_2$O | 25 g/L |
| NaH$_2$PO$_2$•H$_2$O | 25 g/L |
| Malic acid | 4 g/L |
| Succinic acid 2Na | 12 g/L |
| Glycine | 5 g/L |
| Pb(NO$_3$)$_2$ | 0.6 ppm (0.38 ppm as Pb) |
| CoSO$_4$•7H$_2$O | 0 ppm |
| KSCN | 0.4 ppm |

Electroless nickel plating was carried out by using this electroless nickel plating liquid. The pH was 5.0 and the plating conditions were: for 30 min at 80° C. The material to be plated was a semiconductor TEG wafer (with n/p electrodes) comprising a large number of IC, and nickel was deposited on aluminum pads of the IC under natural light irradiation at about 100 Lux.

Comparative Example 4

An electroless nickel plating liquid of the following composition was prepared.

| | |
|---|---|
| NiSO$_4$•6H$_2$O | 25 g/L |
| NaH$_2$PO$_2$•H$_2$O | 25 g/L |
| Malic acid | 4 g/L |
| Succinic acid 2Na | 12 g/L |
| Glycine | 5 g/L |
| Pb(NO$_3$)$_2$ | 0 ppm |
| CoSO$_4$•7H$_2$O | 16 ppm (3.2 ppm as Co) |
| KSCN | 0.4 ppm |

Electroless nickel plating was carried out by using this electroless nickel plating liquid. The pH was 5.0 and the plating conditions were: for 30 min at 80° C. The material to be plated was a semiconductor TEG wafer (with n/p electrodes) comprising a large number of IC, and nickel was deposited on aluminum pads of the IC under natural light irradiation at about 100 Lux.

Comparative Example 5

An electroless nickel plating liquid of the following composition was prepared.

| | |
|---|---|
| NiSO$_4$•6H$_2$O | 25 g/L |
| NaH$_2$PO$_2$•H$_2$O | 25 g/L |
| Malic acid | 4 g/L |
| Succinic acid 2Na | 12 g/L |
| Glycine | 5 g/L |
| Pb(NO$_3$)$_2$ | 0.6 ppm |
| CoSO$_4$•7H$_2$O | 16 ppm (3.2 ppm as Co) |

Electroless nickel plating was carried out by using this electroless nickel plating liquid. The pH was 5.0 and the plating conditions were: for 30 min at 80° C. The material to be plated was a semiconductor TEG wafer (with n/p electrodes) comprising a large number of IC, and nickel was deposited on aluminum pads of the IC under natural light irradiation at about 100 Lux.

FIG. 1 shows photographs of enlarged views of the electroless Ni plating produced in Example 1; the photographs were obtained by optical and electron microscopes. The photographs similarly obtained in Comparative Examples 1-5 are shown in FIGS. 2-6. The results obtained in evaluating nickel that was deposited on the Al pads in Example 1 and Comparative Examples 1-5 are shown in detail in the table. The evaluation items and evaluation methods are described below.

Ni height on P pole and N pole: the heights of Ni on P pole and N pole were measured by a laser microscope. P/N height ratio: the P/N height ratio was calculated after the above-described measurements.

Pinholes: the presence of pinholes was observed with a SEM by enlarging the view by a factor of 5000.

Anomalous deposition (lumps): anomalous deposition (lumps) was observed with a SEM by enlarging the view by a factor of 500.

Pb content: content in the deposited nickel, measured by GDMAS analysis.

As follows from FIG. 1, in Example 1 using the electroless Ni plating liquid of the present invention, uniform electroless Ni plating was performed on Al pads without any influence of surface area and difference in potentials inherent to IC, and the deposition rate of Ni was sufficient. In addition, pinholes and anomalous deposition in Ni as seen in the Comparative Examples were not observed.

Figure 2:
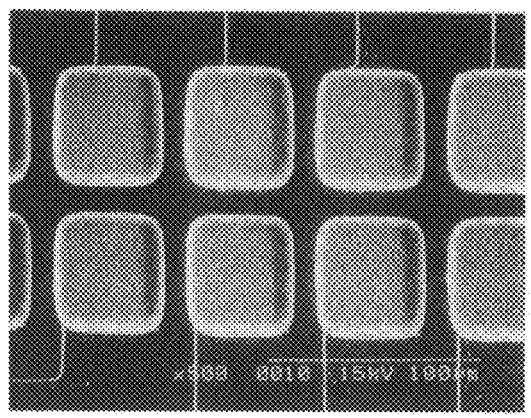
FIG. 2 This is a photograph of an enlarged view by an optical microscope (magnification 500) and a photograph of an enlarged view by an electron microscope (magnification 5000), showing the result of electroless nickel plating on an aluminum pad in Comparative Example 1.
Figure 2:
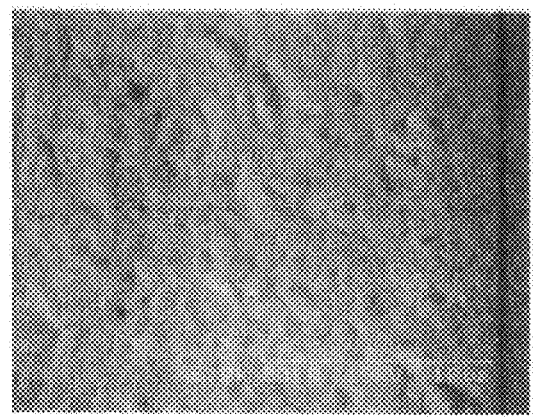
Figure 3:
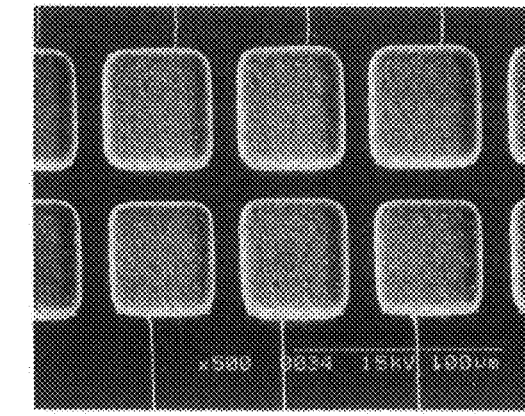
FIG. 3 This is a photograph of an enlarged view by an optical microscope (magnification 500) and a photograph of an enlarged view by an electron microscope (magnification 5000), showing the result of electroless nickel plating on an aluminum pad in Comparative Example 2.
Figure 3:
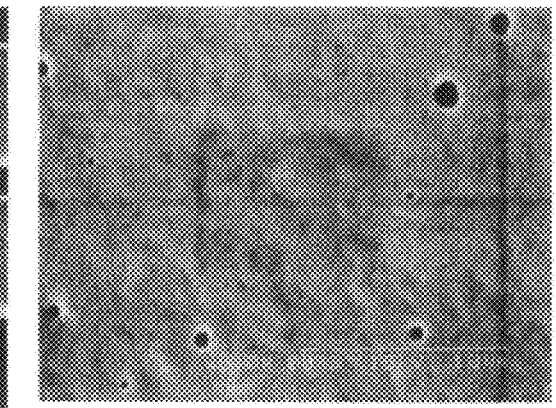
Figure 4:
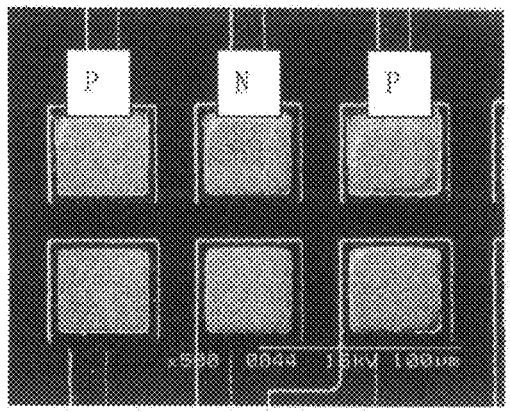
FIG. 4 This is a photograph of an enlarged view by an optical microscope (magnification 500) and a photograph of an enlarged view by an electron microscope (magnification 5000), showing the result of implementing electroless nickel plating on an aluminum pad in Comparative Example 3.
Figure 4:
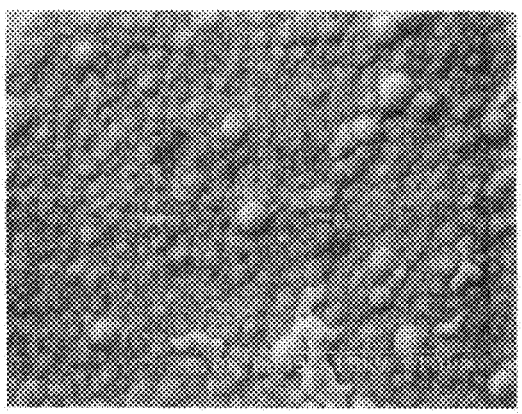
Figure 5:
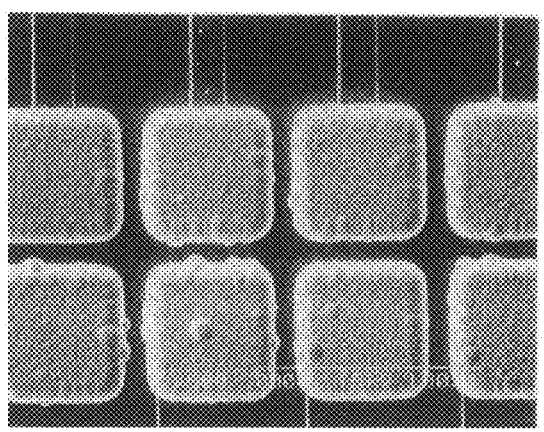
FIG. 5 This is a photograph of an enlarged view by an optical microscope (magnification 500) and a photograph of an enlarged view by an electron microscope (magnification 5000), showing the result of electroless nickel plating on an aluminum pad in Comparative Example 4.
Figure 5:
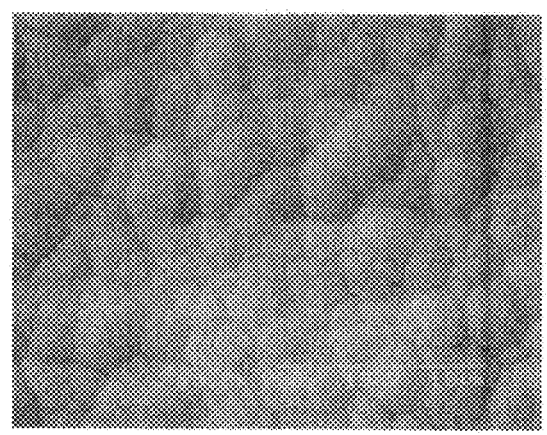
Figure 6:
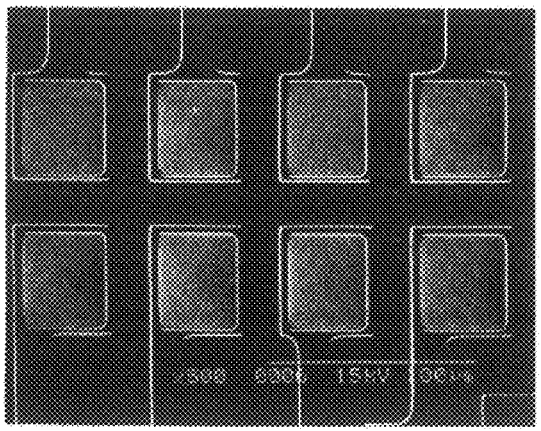
FIG. 6 This is a photograph of an enlarged view by an optical microscope (magnification 500) and a photograph of an enlarged view by an electron microscope (magnification 5000), showing the result of electroless nickel plating on an aluminum pad in Comparative Example 5.
Figure 6:
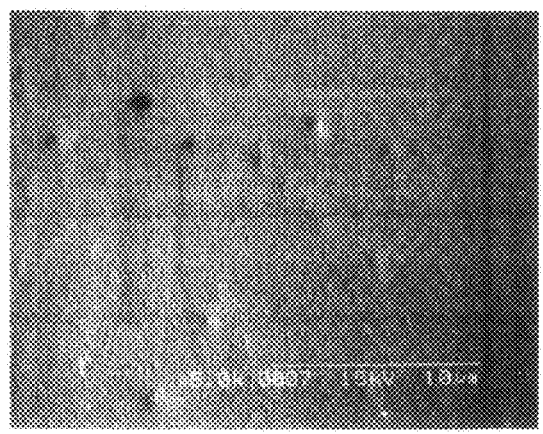

In the photograph of an enlarged view (magnification 5000) of Comparative Example 1 shown in FIG. 2, minute pinholes are observed, and large pinholes are observed in the photograph of an enlarged view (magnification 5000) of Comparative Example 2 shown in FIG. 3. In the photograph of an enlarged view (magnification 500) of Comparative Example 3 shown in FIG. 4, the decrease in Ni height and the influence of the difference between potentials of P/N electrodes are observed. The deposition of Ni was particularly difficult on the N pole. In the photograph of an enlarged view (magnification 500) of Comparative Example 4 shown in FIG. 5, anomalous depositions (lumps) of Ni appear in the circumferential sections of the electrode pads. In the photograph of an enlarged view (magnification 500) of Comparative Example 5 shown in FIG. 6, the decrease in Ni height is observed, and in the photograph of an enlarged view (magnification 5000), a large number of small pinholes are observed.

TABLE 1

| | Ni height P electrode (μm) | P/N height ratio | Pinholes | Anomalous deposition (lumps) | Pb content in Ni (ppm) |
|---|---|---|---|---|---|
| Example 1 | 9.3 | 1.04 | None | None | 100 |
| Comparative Example 1 | 9.5 | 1.03 | Few | None | 100 |
| Comparative Example 2 | 9.4 | 1.03 | Many | None | 100 |
| Comparative Example 3 | 4.0 | 1.7 | None | None | 100 |
| Comparative Example 4 | 9.5 | 1.05 | None | Present | 0 |
| Comparative Example 5 | 3.1 | 1.15 | Many | None | 100 |

INDUSTRIAL APPLICABILITY

With the electroless Ni plating liquid of the present invention, Ni metal bumps (protruding sections) or UBM for solder bumps can be formed by electroless nickel plating with a uniform film thickness, even on silicon wafers composed of multiple IC chips.

The invention claimed is:

1. An electroless nickel plating liquid for an electrode pad in an integrated circuit comprising a water-soluble nickel salt, a reducing agent, a complexing agent and a pH buffer, wherein
lead ion is contained therein at 0.01-1 ppm, cobalt ion is contained therein at 0.01-1 ppm and a sulfur compound selected from the group consisting of a thiosulfate, a thionic acid, thiourea, a thiocyanate, a thiocarbonate, and a salt thereof, is contained therein at 0.01-1 ppm, and
metals in said electroless nickel plating liquid consist of nickel, lead and cobalt.

2. The electroless nickel plating liquid of claim 1, wherein lead ion is contained in an amount of from 0.1-1 ppm, cobalt ion is contained in an amount of 0.3-1 ppm and the sulfur compound is contained in an amount of 0.1-0.5 ppm.

3. The electroless nickel plating liquid of claim 1, wherein the water-soluble nickel salt is at least one member selected from the group consisting of nickel sulfate, nickel chloride and nickel hypophosphite.

4. The electroless nickel plating liquid of claim 1, wherein the reducing agent is at least one member selected from the group consisting of a hypophosphite, dimethylamine borane, trimethylamine borane and hydrazine.

5. The electroless nickel plating liquid of claim 1, wherein the pH buffer is at least one member selected from the group consisting of an acetic acid salt, a formic acid salt, a succinic acid salt, a malonic acid salt and an ammonium salt.

6. The electroless nickel plating liquid of claim 1, wherein the complexing agent is at least one member selected from the group consisting of lactic acid, malic acid, citric acid, glycine and alanine.

7. The electroless nickel plating liquid of claim 1, wherein the lead ion is provided by at least one of lead nitrate and lead acetate.

8. The electroless nickel plating liquid of claim 1, wherein the cobalt ion is provided by at least one member selected from the group consisting of cobalt sulfate, cobalt acetate, cobalt nitrate and cobalt carbonate.

9. The electroless nickel plating liquid of claim 1, wherein the sulfur compound is at least one of potassium thiocyanate and rhodanine.

* * * * *